United States Patent
Osada et al.

(10) Patent No.: US 7,763,346 B2
(45) Date of Patent: Jul. 27, 2010

(54) SURFACE COATED CUTTING TOOL MADE OF CERMET HAVING PROPERTY-MODIFIED α TYPE $AL_2O_3$ LAYER OF HARD COATING LAYER

(75) Inventors: Akira Osada, Naka (JP); Eiji Nakamura, Naka (JP); Hisashi Honma, Naka (JP)

(73) Assignee: Mitsubishi Materials Corporation, Tokyo (JP)

( * ) Notice: Subject to any disclaimer, the term of this patent is extended or adjusted under 35 U.S.C. 154(b) by 714 days.

(21) Appl. No.: 11/561,285

(22) Filed: Nov. 17, 2006

(65) Prior Publication Data
US 2007/0116985 A1    May 24, 2007

(30) Foreign Application Priority Data
Nov. 18, 2005    (JP)    .............................. 2005-333539

(51) Int. Cl.
*B23P 15/28*    (2006.01)
(52) U.S. Cl. ........................... 428/216; 51/307; 51/309; 428/336; 428/698; 428/701; 428/702
(58) Field of Classification Search .................. 51/307, 51/309; 428/216, 336, 698, 701, 702
See application file for complete search history.

(56) References Cited

U.S. PATENT DOCUMENTS

| 6,333,103 | B1 * | 12/2001 | Ishii et al. | ...................... 51/309 |
| 7,201,956 | B2 * | 4/2007 | Oshika et al. | ............... 428/702 |
| 7,442,432 | B2 * | 10/2008 | Ruppi | ........................ 428/701 |

FOREIGN PATENT DOCUMENTS

| EP | 1464727 | 10/2004 |
| EP | 1655388 | 5/2006 |
| EP | 1683893 | 7/2006 |
| JP | 6-008010 A | 1/1994 |
| JP | 6-031503 A | 2/1994 |

OTHER PUBLICATIONS

Patent Abstracts of Japan for JP6-008010 published on Jan. 18, 1994.
Patent Abstracts of Japan for JP6-031503 published on Feb. 8, 1994.
Ruppi, S., "Deposition, Microstructure and Properties of Texture-Controlled CVD a-Al2O3 Coatings," International Journal of Refractory Metals and Hard Materials, vol. 23, 2005. p. 306-316.
Kim, J-G., et al., "Effect of Partial Pressure of the Reactant Gas on the Chemical Vapour Deposition of Al2O3," Thin Solid Films, vol. 97, 1982, 97-106.

* cited by examiner

*Primary Examiner*—Archene Turner
(74) *Attorney, Agent, or Firm*—Leason Ellis LLP.

(57) ABSTRACT

A surface coated cermet cutting tool comprising a tool body and a hard coating layer formed on the surface of the tool body, wherein the hard coating layer has a lower layer of a titanium compound layer and an upper layer of property-modified α type $Al_2O_3$ layer that has a crystal grain boundary orientation determined using a field emission type scanning electron microscope and an electron back-scattered diffraction pattern imaging device such that crystal grain boundary units of not less than 45% of all the grain boundaries show intersection angles of 15° or less between normals of (0001) planes and between normals of {10-10} planes, where a crystal grain boundary unit is a crystal grain boundary of adjacent pair of crystal grains.

1 Claim, 1 Drawing Sheet

SURFACE COATED CUTTING TOOL MADE OF CERMET HAVING PROPERTY-MODIFIED α TYPE $AL_2O_3$ LAYER OF HARD COATING LAYER

BACKGROUND OF THE INVENTION

1. Field of the Invention

The invention relates to a surface coated cermet cutting tool having a hard coating layer in which an upper layer composed of a property-modified α-type $Al_2O_3$ layer that exhibits excellent crystal grain boundary strength. Especially, the invention relates to a surface coated cermet cutting tool (hereafter referred to as a coated cermet tool) which has excellent chipping resistance of the hard coating layer and exhibits excellent wear resistance over a long period of time in a case of high-speed cutting of difficult-to-cut material such as soft-steel, stainless steel, and high-manganese steel that have high viscosity, high adherence to the hard coating layer on the surface of a cutting tool and cause extremely high cutting resistance. Priority is claimed on Japanese Patent Application No. 2005-333539, filed Nov. 18, 2005 the contents of which is incorporated herein with reference.

2. Description of Related Art

In the prior art, a coated hard metal tool having a main body composed of tungsten carbide (WC) based hard metal or titanium carbonitride (TiCN) based cermet, and a hard coating deposited on the surface of the main body (hereafter referred to as a tool body) have generally been known. A configuration of the hard coating is known to have the following lower layer and upper layer.

(a) The lower layer of a Ti compound layer has a 3-20 μm thickness and consists of one or more layers selected from a titanium carbide (hereafter referred to as TiC) layer, a titanium nitride (hereafter referred to as TiN) layer, a titanium carbonitride (hereafter referred to as TiCN) layer, a titanium carboxide (hereafter referred to as TiCO) layer, and a titanium oxycarbonitride (hereafter referred to as TiCNO) layer each of which is formed by chemical vapor deposition.

(b) The upper layer of the hard coating consists of an aluminum oxide layer (hereafter referred to as conventional α type $Al_2O_3$ layer) which is formed by chemical vapor deposition so as to have an α type crystal structure and an average thickness of 2 to 20 μm.

It is well known that the above-described conventional coated cermet tool can be employed to the cutting of, for example, various steels of general grades and ordinary cast irons (Japanese Unexamined Patent Application, First Publication No. H6-31503: Patent Reference 1).

It is also known that, in the above-described coated cermet tool, each layer as a constituent of the hard coating layer generally has a granular crystal texture, and in order to enhance the strength of the titanium compound lower layer, TiCN layer as a constituent of the lower layer may be provided with longitudinally growing crystal structure by deposition using a common chemical vapor deposition apparatus, a reaction atmosphere of mixed gas containing organic carbonitride, and a moderate deposition temperature within a range of 700 to 950° C. (Japanese Unexamined Patent Application, First Publication No. H6-8010: Patent Reference 2).

In recent years, cutting machines are given a remarkably high performance. On the other hand, there is a strong demand for labor reduction, energy saving, and cost reduction during cutting operation. In accordance with such circumstances, cutting speed required for the cutting operation tends to be increased.

The above-described conventional coated cermet tools cause no problems when they are used for high-speed cutting of general steel such as low-alloy steel and carbon steel and ordinal cast irons such as gray iron. However, the conventional coated cermet tools reach the end of their tool life within a relatively short time, when these cutting tools are used for high speed cutting of difficult-to-cut materials such as soft steel, stainless steel, and high manganese steel or the like. The short tool life of the conventional coated cermet tool may be explained as follows. The difficult-to-cut material itself has a high viscosity, and during operation, is highly adhesive to the hard coating layer of the surface of the cutting tool. During high speed cutting while generating high-heat, the above-described properties of the difficult-to-cut material are further enhanced and the cutting force is increased. On the other hand, high-temperature strength of the conventional α type $Al_2O_3$ layers of the above-described conventional coated cermet tools are not sufficient to resist such a high cutting force. Therefore, cutting edges of the conventional coated cermet tools occur chipping easily during high-speed cutting of difficult-to-cut materials.

SUMMARY OF THE INVENTION

Based on the consideration of the above-described circumstance, the inventors of the present invention paid attention to the coated cermet tool which has α type $Al_2O_3$ layer constituting an upper layer of the hard coating, made extensive study so as to enhance the chipping resistance of the α type $Al_2O_3$ layer and reached the following results summarized from (a) to (c).

(a) The conventional α type $Al_2O_3$ layer as a hard coating layer of the above-described conventional coated cermet tool is generally deposited by a common chemical vapor deposition apparatus under conditions including:

a reaction gas composition containing, by volumetric %, 2 to 4% of $AlCl_3$, 4 to 8% of $CO_2$, 1 to 3% of HCl, 0.05 to 0.2% of $H_2S$, and balance consisting of $H_2$;

a temperature of a reaction atmosphere being from 1020 to 1050° C.; and a pressure of the reaction atmosphere being from 6 to 10 kPa.

However, if an α type $Al_2O_3$ layer is formed by a common chemical vapor deposition apparatus, for example under conditions including:

a reaction gas composition containing, by volumetric %, 6 to 10% of $AlCl_3$, 4 to 8% of $CO_2$, 3 to 5% of HCl, 0.25 to 0.6% of $H_2S$, and balance consisting of $H_2$;

a temperature of a reaction atmosphere being from 920 to 1000° C.; and a pressure of the reaction atmosphere being from 6 to 10 kPa, the resultant α type $Al_2O_3$ layer (hereafter referred to as property-modified a type $Al_2O_3$ layer) is provided with, in addition to the excellent high-temperature hardness and heat resistance as intrinsic properties of α type $Al_2O_3$, further superior high-temperature strength compared with the conventional α type $Al_2O_3$ layer.

(b) The structure of the above-described conventional α type $Al_2O_3$ layer and the property-modified α type $Al_2O_3$ layer was compared in accordance with the following procedure.

Using a field emission type scanning electron microscope and an electron back-scattered diffraction pattern imaging device, in a measurement region on a polished surface, an electron beam was irradiated on each crystal grain having hexagonal crystal lattice so as to measure an intersection angle of normal of each of crystal faces subtending to a normal of the polished surface. The relation between the hexagonal crystal lattice of a crystal grain and a polished surface of the α type $Al_2O_3$ layer is exemplified by a schematical strabismic view of FIG. 1.

Based on the measurement, in a crystal grain boundary of each of adjacent pairs of crystal grains (grain boundary unit), an intersection angle between normals of (0001) planes and an intersection angle between normals of {10-10} planes were determined.

Where a grain boundary between two adjacent grain is defined as a grain boundary unit, in the above-described property-modified α type $Al_2O_3$ layer, normals of (0001) planes and normals of {10-10} planes of adjacent grains respectively form intersection angles of 15° or less in grain boundary units of not less than 45% (in number) of all the grain boundaries. Whereas, in the above-described conventional α type $Al_2O_3$ layer, normals of (0001) planes and normals of {10-10} planes of adjacent grains respectively form intersection angles of 15° or less in not more than 25% grain boundary units of all the grain boundaries.

The above-described result indicates that the above-described property-modified α type $Al_2O_3$ layer has further superior crystal grain boundary strength compared to the conventional α type $Al_2O_3$ layer. High temperature strength as a intrinsic property of the α type $Al_2O_3$ layer is also improved in the property-modified α type $Al_2O_3$ layer having thus improved crystal grain boundary strength.

(c) Accordingly, if a coated cermet tool comprises a hard coating layer including a lower layer of Ti compound layer, and an upper layer of the above-described property-modified α type $Al_2O_3$ layer that has, in addition to excellent high temperature hardness and heat resistance, excellent high temperature strength, even when the coated cermet tool is used for high-speed cutting of a difficult-to-cut material showing specifically high cutting force, chipping does not occur on the hard coating layer, and the hard coating layer may exhibit excellent wear resistance over a long duration.

The present invention was invented based on the above-described results from examination.

A coated cermet tool of the present invention comprises a tool body and a hard coating layer of the following constitution vapor-deposited on the tool body.
(a) An lower layer of the hard coating layer is a titanium compound layer having an overall average thickness of 3 to 20 μm and includes one or more chemically vapor-deposited layers selected from a titanium carbide layer, a titanium nitride layer, titanium carbonitride layer, a titanium carboxide layer, and a titanium oxycarbonitride layer.
(b) An upper layer of the hard coating layer is a property modified α type aluminium oxide layer that has an average thickness of 2-20 μm and is composed of $Al_2O_3$ of α type crystal structure at a chemically deposited state, and has a crystal grain boundary orientation such that intersection angles between normals of (0001) planes and intersection angles between normals of {10-10} planes are 15° or less in grain boundary units of not less than 45% in number over all the grain boundaries, wherein each of the crystal grain boundary units denotes a grain boundary between two adjacent crystal grains, and the crystal grain boundary orientation of the upper layer is determined using a field emission type scanning electron microscope and an electron-backscattered diffraction pattern imaging device by a method comprising; irradiating an electron beam on each of crystal grains having a hexagonal crystal lattice in a measurement region on a polished surface; performing a measurement of an intersection angle of normal of each of crystal faces subtending to a normal of the polished surface; selecting (0001) planes and {10-10} planes of each crystals based on the measurement; and determining an intersection angle between normals of (0001) planes and an intersection angle between normals of {10-10} planes at each of the crystal grain boundary units In the coated cermet tool of above described constitution, the property-modified α type $Al_2O_3$ layer exhibits excellent crystal grain boundary strength and, especially in the case of high-speed cutting of difficult-to-cut material, the hard coating layer exhibits excellent resistance to chipping.

The following is an explanation for the basis of the above-described limitation of the constituent layers of the hard coating layer of the coated cermet tool of the present invention.

(a) Ti Compound Layer (Lower Layer)

Fundamentally, the Ti compound layer exists as a lower layer for the upper layer of the property-modified α type $Al_2O_3$ layer and contributes to the improvement of the high-temperature strength of the hard coating layer by excellent intrinsic high-temperature strength. It adheres tightly to both the tool body and the property-modified α type $Al_2O_3$ layer, and contributes to the improvement of bond between the hard coating layer and the tool body. However, if the overall average thickness of the Ti compound layer is thinner than 3 μm, it is difficult to achieve the above-described effects sufficiently. On the other hand, if the overall average thickness of the Ti compound layer exceeds 20 μm, the Ti compound layer tends to occur thermal plastic deformation especially in the case of high-speed cutting of difficult-to-cut material accompanied with high-heat generation, and causes a biased wear. Therefore, overall average thickness of the Ti compound layer was set to be 3 to 20 μm.

(b) Property-modified α Type $Al_2O_3$ Layer (Upper Layer)

As a result of extensive research, it was clear that the crystal grain boundary strength of the α type $Al_2O_3$ layer was highly improved if the α type $Al_2O_3$ layer had a crystal grain boundary orientation such that normals of (0001) planes and normals of {10-10} planes of adjacent grains respectively formed intersection angles of 15° or less in grain boundary units of not less than 45% of all grain boundaries of the α type $Al_2O_3$ layer. Therefore, if the intersection angles of the normals are, for example, 16°, or if the grain boundary units that show intersection angles of normals of 15° or less have proportion of less than 45% of all the grain boundaries, it is impossible to ensure a desirable crystal grain boundary strength. On the other hand, when the above-described crystal grain boundary orientation is satisfied, the property-modified α type $Al_2O_3$ layer is provided with a high temperature strength, in addition to the high temperature hardness and heat resistance which is intrinsic to the α type $Al_2O_3$.

If the average thickness of the property-modified α type $Al_2O_3$ is less than 2 μm, the hard coating layer cannot be provided with the above-described property sufficiently. On the other hand, if the average thickness of the layer exceeds 20

μm, the hard coating tends to occur chipping during high-speed cutting of a difficult-to-cut material. Therefore, the average thickness of the layer was set to be from 2 to 20 μm.

Optionally, a TiN layer showing a golden color may be deposited as an outermost layer of the hard coating layer. Such a layer may serve as a discrimination layer before or after using the tool. In this case, the average thickness of the TiN layer may be from 0.1 to 1 μm.

If the average thickness of the TiN layer is less than 0.1 μm, the layer cannot serve as an effective discrimination layer. On the other hand, the effect of discrimination can be sufficiently realized if the TiN layer has an average thickness up to 1 μm.

In the coated cermet tool of the invention, the property-modified α type $Al_2O_3$ layer as a constituent of the upper layer of the hard coating layer has, in addition to its excellent intrinsic high-temperature hardness and heat resistance, excellent high-temperature strength. Since those effects of the $Al_2O_3$ layer are multiplied on the high temperature strength shown by the Ti compound layer, even during high-speed cutting of a difficult-to-cut material having high cutting resistance, the coated cermet tool of the present invention's hard coating layer doesn't chip, exerts excellent wear resistance and has a long tool life.

DETAILED DESCRIPTION OF THE INVENTION

Figure 1:
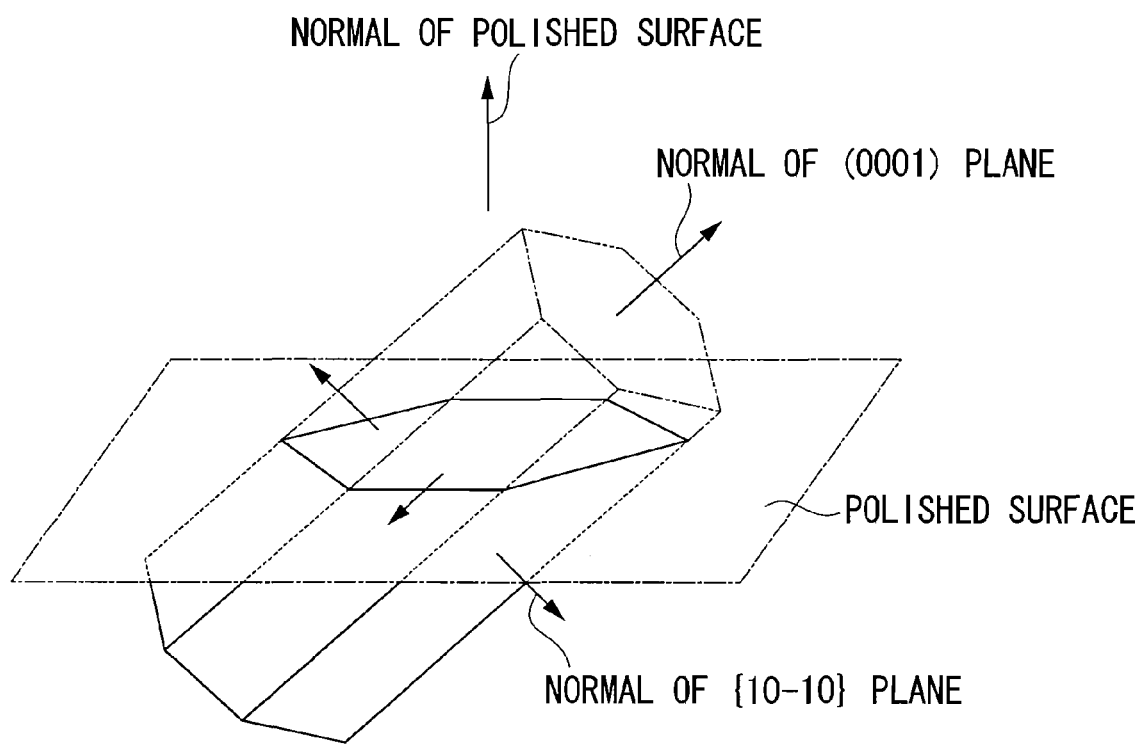
FIG. 1 is a strabismic view schematically illustrating the relation between a polished surface of an α type $Al_2O_3$ layer and hexagonal crystal lattice of a crystal grain as a constituent of the α type $Al_2O_3$ layer.

Next, a coated cermet tool of the present invention is explained with reference to examples.

EXAMPLE

As constituent powders, WC powder, TiC powder, ZrC powder, VC powder, TaC powder, NbC powder, $Cr_3C_2$ powder, TiN powder, and Co powder, all of which had an average grain diameter in a range from 1 to 3 μm, were prepared and mixed in accordance with the compounding ratios presented in Table 1. The constituent powders were blended into wax and blended into acetone using a ball mill for 24 hours. After being dried under reduced pressure, the mixed powders were press-molded under a pressure of 98 MPa so as to form compacts having a predetermined shape. The compacts were sintered under conditions including: a vacuum of 5 Pa, heating the compacts at a predetermined temperature within a range of 1370 to 1470° C., maintaining the compacts at the predetermined temperature for 1 hour. After the sintering, the cutting edges of the compacts were subjected to honing of R:0.07 mm. Thus, tool bodies A to F made of WC based hard metal having a geometrical configuration of an insert meeting the ISO standard CNMG120408 were produced.

In addition, as constituent powders, TiCN powder (TiC/TiN=50/50 by weight ratio), $Mo_2C$ powder, ZrC powder, NbC powder, TaC powder, WC powder, Co powder and Ni powder, all of which had an average grain diameter ranging from 0.5 to 2 μm were prepared. These constituent powders were mixed in accordance with the compounding ratios presented in Table 2, blended under wet conditions using a ball mill for 24 hours. After being dried, the mixed powders were press-molded under a pressure of 98 MPa so as to form compacts. The compacts were held in a nitrogen atmosphere of 1.3 kPa at a temperature of 1540° C. for one hour so as to be sintered. After the sintering, the compacts were shaped by shaping the cutting edges by honing of R:0.07 to tool bodies a to f made of TiCN based cermet each having a geometrical configuration of an insert meeting the ISO standard of CNMG 120412.

Next each of the above-described tool bodies A-F and a-f was introduced in a common type of chemical vapor deposition apparatus.

(a) Firstly, under conditions listed in Table 3, a Ti compound layer having a designed layer thickness shown in Table 4 was vapor-deposited as an lower layer of a hard coating layer on the tool body. In Table 3, conditions for 1-TiCN show the formation condition of TiCN layer composed of crystals having the longitudinally growing crystal structure described in Japanese Patent Application, First Publication No. H6-8010. The other conditions listed in Table 3 show formation conditions of a Ti compound layer having a common granular crystal texture.

(b) Next, a property-modified α type $Al_2O_3$ layer was formed as an upper layer having the designed thickness shown in Table 4 was formed on the above-described lower layer, under conditions including:

a reaction gas composition containing, by volumetric %, predetermined amount of $AlCl_3$ within a range of 6 to 10%, 6% of $CO_2$, 4% of HCl, predetermined amount of $H_2S$ within a range of 0.25 to 0.6%, and balance consisting of $H_2$;

the temperature of the reaction atmosphere being 960° C.; and the pressure of reaction atmosphere being 8 kPa, Thus, the surface coated cermet tools 1-13 according to the present invention were produced.

In addition, as comparative examples, comparative surface coated cermet tools 1-13 were formed using almost the same conditions as the above-described surface coated cermet tools 1-13 of the invention. Whereas, in each of the comparative surface coated cermet tools 1-13, a conventional α type $Al_2O_3$ layer was formed as an upper layer on the above-described lower layer so as to have a designed thickness shown in Table 5, under conditions including:

a reaction gas composition containing, by volumetric %, predetermined amount of $AlCl_3$ within a range of 2 to 4%, 6% of $CO_2$, 2% of HCl, predetermined amount of $H_2S$ within a range of 0.05 to 0.2%, and balance consisting of $H_2$;

the temperature of the reaction atmosphere being 1030° C.; and the pressure of the reaction atmosphere being 8 kPa.

Next, orientations of grain boundaries of crystal grains (hereafter referred to as crystal grain boundary orientation) of the property-modified $Al_2O_3$ layers of the above described coated cermet tool 1-13 of the invention, and crystal grain boundary orientations of the conventional $Al_2O_3$ layers of the above described comparative coated cermet tools 1-13 were examined using a field emission type scanning electron microscope and an electron back-scattered diffraction pattern imaging device.

First, after polishing the surfaces of the property-modified α type $Al_2O_3$ layers and the conventional α type $Al_2O_3$ layers, the coated cermet tools 1-13 of the invention and the comparative coated cement tools 1-13 were each set in a column of the field emission type scanning electron microscope. Accelerating voltage and irradiation current of an electron beam were 15 kV and 1 nA respectively. Within a field for measurement on the above-described polished surface, each crystal grain having a hexagonal crystal lattice was irradiated with the electron beam with an irradiation angle of 70° subtending to the polished surface. Using the electron back-scattered diffraction pattern imaging device, while changing the analysis point with every 0.1 μm/step interval in a region of 30×50 μm, angles of the normals (normal axes) of crystal faces of the above described crystal grain subtending to the normal of the polished surface were measured in the each analysis point. From the results of measurement, (0001) plane and {10-10} plane as constituent crystal faces were selected for each crystal. For each pair of adjacent crystal grains (two crystal grains adjacent to each other), an intersection angle between the normal of (0001) plane of a crystal and the normal of (0001) plane of a crystal was determined. In the same manner, an intersection angle between the normals of {10-10} planes of adjacent crystals was determined for each pair of adjacent crystal grains. The crystal grain boundary between one pair of adjacent crystal grains was regarded as a crystal grain boundary unit. From the results of analysis, proportions of the number of crystal grain boundary units showing intersection angles 15° or less between the normals of (0001) planes and between the normals of {10-10} planes to the total number of crystal grain boundary units (hereafter referred to as a proportion of crystal grain boundary units having intersection angles of 15° or less) were calculated and shown in Tables 4 and 5.

As shown in Tables 4 and 5, all of the property-modified α type $Al_2O_3$ layers of the above-described coated cermet tool 1-13 of the invention showed the crystal grain boundary orientation such that not less than 45% crystal grain boundary units of all the grain boundaries showed the above-described intersection angles of 15° or less. On the other hand, all of the conventional α type $Al_2O_3$ layers of the above-described conventional coated cermet tool 1 to 13 showed crystal grain boundary orientation such that only not more than 25% of crystal grain boundary units of all the grain boundaries showed the above described intersection angles of 15° or less.

The thickness of the constituent layers of the above-described coated cermet tools 1-13 of the invention and conventional coated cermet tools 1-13 were measured from the longitudinal section of each tool. As the average thickness calculated from the thickness measured at 5 points, all the samples showed a value substantially similar to the designed thickness.

Next, the above-described coated cermet tools 1-13 and conventional coated cermet tools 1-13 were each screw-mounted with a fixture-jig on an end of a bit made of tool steel, and were subjected to the following tests of high-speed cutting.

Intermittent cutting tests on a stainless steel were carried out under high-speed (compared with the normal cutting speed of 150 m/min) and, dry cutting conditions (conditions A) comprising:
 a workpiece: a round bar of JIS·SUS430 having four longitudinal groove disposed with a constant interval;
 cutting speed: 250 m/min;
 depth of cut: 1.2 mm;
 feed: 0.25 mm/rev; and
 cutting time: 10 minutes.

Continuous cutting tests on a soft steel were carried out under high-speed (compared with normal cutting speed of 250 m/min) and dry cutting conditions (conditions B) comprising:
 workpiece: a round bar of JIS·S15C;
 cutting speed: 400 m/min;
 depth of cut: 1.5 mm;
 feed: 0.28 mm/rev; and
 cutting time: 10 minutes.

In addition, intermittent cutting tests of high-manganese steel were carried out under high-speed (compared with the normal cutting speed of 150 m/min) and dry cutting conditions (condition C) comprising:
 workpiece: a round bar of JIS·SMn443 having four longitudinal groove disposed with a constant interval;
 cutting speed: 250 m/min;
 depth of cut: 1.5 mm;
 feed: 0.22 mm/rev; and
 cutting time: 10 minutes.

In each of the cutting tests, the widths of the flank wear of the cutting edges were measured. The results of the measurements are listed in Tables 6.

TABLE 1

| Type | | Compound composition (mass %) | | | | | | | |
|---|---|---|---|---|---|---|---|---|---|
| | | Co | TiC | ZrC | VC | TaC | NbC | $Cr_3C_2$ | TiN | TiCN |
| TOOL BODY | A | 7 | 2 | — | — | 5 | 1 | 0.4 | 1.5 | balance |
| | B | 5.7 | — | — | — | 1.5 | 0.5 | — | — | balance |
| | C | 5.7 | — | — | — | — | — | 0.3 | — | balance |
| | D | 8.5 | — | 3 | — | 4 | — | — | — | balance |
| | E | 12.5 | 3 | — | — | 4.5 | 0.5 | — | 2.5 | balance |
| | F | 14 | 4 | — | 0.2 | — | 6 | 0.8 | 3 | balance |

TABLE 2

| TYPE | | Compound composition (mass %) | | | | | | | |
|---|---|---|---|---|---|---|---|---|---|
| | | Co | Ni | ZrC | TaC | NbC | $Mo_2C$ | WC | TiCN |
| TOOL BODY | a | 13 | 5 | — | 10 | — | 10 | 16 | balance |
| | b | 8 | 7 | — | 5 | — | 7.5 | — | balance |
| | c | 5 | — | — | — | — | 6 | 10 | balance |
| | d | 10 | 5 | — | 11 | 2 | — | — | balance |
| | e | 9 | 4 | 1 | 8 | — | 10 | 10 | balance |
| | f | 12 | 5.5 | — | 10 | — | 9.5 | 14.5 | balance |

TABLE 3

| | LOWER LAYER (Ti COMPOUND LAYER) | FORMATION CONDITIONS | | |
|---|---|---|---|---|
| | DESIGNED | | REACTION ATMOSPHERE | |
| TYPE | COMPOSITION | REACTION GAS COMPOSITION (vol %) | PRESSURE (kPa) | TEMPERATURE (° C.) |
| TiC LAYER | TiC | $TiCl_4$: 4.2%, $CH_4$: 8%, $H_2$: balance | 7 | 1020 |
| TiN LAYER (First Layer) | TiN | $TiCl_4$: 4.2%, $N_2$: 30%, $H_2$: balance | 30 | 900 |
| TiN LAYER (Other layer) | TiN | $TiCl_4$: 4.2%, $N_2$: 35%, $H_2$: balance | 50 | 1040 |
| I—TiCN LAYER | $TiC_{0.5}N_{0.5}$ | $TiCl_4$: 4.2%, $N_2$: 35%, $CH_3CN$: 0.6%, $H_2$: balance | 7 | 1000 |
| TiCN LAYER | $TiC_{0.5}N_{0.5}$ | $TiCl_4$: 4.2%, $N_2$: 20%, $CH_4$: 4%, $H_2$: balance | 12 | 1020 |
| TiCO LAYER | $TiC_{0.5}O_{0.5}$ | $TiCl_4$: 4.2%, CO: 4%, $H_2$: balance | 7 | 1020 |
| TiCNO LAYER | $TiC_{0.2}N_{0.3}O_{0.5}$ | $TiCl_4$: 4.2%, CO: 4%, $CH_4$: 3%, $N_2$: 20%, $H_2$: balance | 20 | 1020 |

Numerals in the designed composition indicates atomic ratio.

TABLE 4

| | | HARD COATING LAYER | | | | | |
|---|---|---|---|---|---|---|---|
| | | LOWER LAYER | | | | UPPER LAYER (MODIFIED TYPE $\alpha Al_2O_3$ LAYER) | |
| | | (Ti COMPOUND LAYER) (DESIGNED THICKNESS: μm) | | | | DESIGNED | PROPORTION OF GRAIN BOUNDARY UNITS SHOWING |
| TYPE | | TYPE OF TOOL BODY | 1st LAYER | 2nd LAYER | 3rd LAYER | 4th LAYER | THICKNESS (μm) | INTERSECTION ANGLES OF 15° OR LESS (%) |
| COATED CERMET TOOL OF THE INVENTION | 1 | A | TiN (1) | I—TiCN (17.5) | TiN (1) | TiCNO (0.5) | 2 | 45 |
| | 2 | a | TiCN (1) | I—TiCN (8.5) | TiCO (0.5) | — | 9 | 58 |
| | 3 | B | TiN (1) | I—TiCN (4) | TiC (4) | TiCNO (1) | 13 | 60 |
| | 4 | b | TiC (1) | I—TiCN (9) | — | — | 10 | 68 |
| | 5 | C | TiN (1) | I—TiCN (10) | TiCNO (0.5) | — | 5 | 66 |
| | 6 | c | TiN (0.5) | I—TiCN (1.5) | TiC (0.5) | TiCNO (0.5) | 20 | 56 |
| | 7 | D | TiN (0.5) | I—TiCN (10) | TiC (2) | TiCNO (0.3) | 6 | 53 |
| | 8 | d | TiN (1) | TiCN (19) | — | — | 3 | 51 |
| | 9 | E | TiC (0.5) | I—TiCN (9) | TiCO (0.5) | — | 10 | 65 |
| | 10 | e | TiN (1) | TiC (1) | TiCN (7) | TiCO (1) | 8 | 64 |
| | 11 | F | TiN (1) | TiC (1) | I—TiCN (8) | — | 12 | 70 |
| | 12 | D | TiC (1) | I—TiCN (4) | TiCNO (1) | — | 15 | 59 |
| | 13 | f | TiCN (0.5) | TiC (2) | TiCNO (0.5) | — | 18 | 47 |

TABLE 5

| | | | HARD COATING LAYER | | | | | |
|---|---|---|---|---|---|---|---|---|
| | | | LOWER LAYER (Ti COMPOUND LAYER) | | | | | UPPER LAYER (CONVENTIONAL $\alpha$ TYPE $Al_2O_3$ LAYER) |
| | | TYPE | | | | | DESIGNED | PROPORTION OF GRAIN BOUNDARY UNITS SHOWING |
| TYPE | | OF TOOL BODY | 1st LAYER | 2nd LAYER | 3rd LAYER | 4th LAYER | THICKNESS (μm) | INTERSECTION ANGLES OF 15° OR LESS (%) |
| CONVENTIONAL COATED CERMET TOOL | 1 | SAME AS COATED CERMET TOOL 1 OF THE INVENTION | | | | | 2 | 10 |
| | 2 | SAME AS COATED CERMET TOOL 2 OF THE INVENTION | | | | | 9 | 22 |
| | 3 | SAME AS COATED CERMET TOOL 3 OF THE INVENTION | | | | | 13 | 6 |
| | 4 | SAME AS COATED CERMET TOOL 4 OF THE INVENTION | | | | | 10 | 18 |
| | 5 | SAME AS COATED CERMET TOOL 5 OF THE INVENTION | | | | | 5 | 3 |
| | 6 | SAME AS COATED CERMET TOOL 6 OF THE INVENTION | | | | | 20 | 12 |
| | 7 | SAME AS COATED CERMET TOOL 7 OF THE INVENTION | | | | | 6 | 17 |
| | 8 | SAME AS COATED CERMET TOOL 8 OF THE INVENTION | | | | | 3 | 5 |
| | 9 | SAME AS COATED CERMET TOOL 9 OF THE INVENTION | | | | | 10 | 25 |
| | 10 | SAME AS COATED CERMET TOOL 10 OF THE INVENTION | | | | | 8 | 15 |
| | 11 | SAME AS COATED CERMET TOOL 11 OF THE INVENTION | | | | | 12 | 20 |
| | 12 | SAME AS COATED CERMET TOOL 12 OF THE INVENTION | | | | | 15 | 9 |
| | 13 | SAME AS COATED CERMET TOOL 13 OF THE INVENTION | | | | | 18 | 13 |

TABLE 6

| TYPE | | WIDTH OF FLANK WEAR (mm) | | | TYPE | | RESULT OF CUTTING TEST (minute) | | |
| --- | --- | --- | --- | --- | --- | --- | --- | --- | --- |
| | | CUTTING CONDITION A | CUTTING CONDITION B | CUTTING CONDITION C | | | CUTTING CONDITION A | CUTTING CONDITION B | CUTTING CONDITION C |
| COATED CERMET TOOL OF THE INVENTION | 1 | 0.32 | 0.34 | 0.31 | CONVENTIONAL COATED CERMET TOOL | 1 | 1.0 | 0.3 | 0.8 |
| | 2 | 0.25 | 0.28 | 0.25 | | 2 | 1.6 | 1.5 | 1.4 |
| | 3 | 0.22 | 0.25 | 0.24 | | 3 | 0.7 | 0.6 | 0.4 |
| | 4 | 0.19 | 0.20 | 0.18 | | 4 | 1.6 | 1.3 | 1.2 |
| | 5 | 0.22 | 0.24 | 0.22 | | 5 | 1.1 | 0.4 | 0.9 |
| | 6 | 0.27 | 0.29 | 0.30 | | 6 | 0.2 | 0.9 | 0.1 |
| | 7 | 0.26 | 0.28 | 0.27 | | 7 | 1.5 | 1.2 | 1.2 |
| | 8 | 0.29 | 0.31 | 0.28 | | 8 | 0.9 | 0.1 | 0.6 |
| | 9 | 0.20 | 0.24 | 0.20 | | 9 | 2.1 | 1.9 | 1.7 |
| | 10 | 0.21 | 0.22 | 0.19 | | 10 | 1.2 | 1.0 | 0.9 |
| | 11 | 0.18 | 0.20 | 0.19 | | 11 | 1.8 | 1.7 | 1.6 |
| | 12 | 0.24 | 0.26 | 0.27 | | 12 | 0.5 | 0.8 | 0.5 |
| | 13 | 0.30 | 0.32 | 0.33 | | 13 | 0.4 | 1.5 | 0.3 |

(In Table 6, the results of the cutting test show the cutting time until each tool reaches the end of tool life because of the generation of chipping in the hard coating layer.)

The results shown in Tables 4 to 6 clearly indicate the advantageous effects of the present invention as explained in the following. The coated cermet tools 1-13 according to the invention each comprise a hard coating layer having a property-modified α type $Al_2O_3$ layer that shows an excellent crystal grain boundary orientation such that crystal grain boundary units showing intersection angles of 15° or less have a proportion of not less than 45% over all the grain boundaries. As a result, the property-modified α type $Al_2O_3$ layer has, in addition to excellent high-temperature hardness and heat resistance, excellent crystal grain boundary strength, that is, excellent high temperature strength. Accordingly, even during high speed cutting of difficult-to-cut materials that have especially high cutting resistance, the coated cermet tools 1-13 of the invention exhibit excellent wear resistance without occurring chipping. On the other hand, in the crystal grain boundary orientation of conventional α type $Al_2O_3$ layer as the upper layer of the hard coating layer, the proportion of crystal grain boundary units showing intersection angles of 15° or less is not more than 25%. As a result, the conventional a type $Al_2O_3$ layer is not provided with a sufficiently satisfactory high temperature strength. Therefore, each of the conventional coated cermet tools 1-13 occurred chipping during high-speed cutting of the difficult-to-cut material and reached its tool life in a relatively short time.

Difficult-to-cut materials such as soft steels, stainless steels, and high-manganese steels, have high cutting resistance because of high viscosity and high adhesion to the surface of a cutting tool. As described-above, even in the high-speed cutting of such difficult-to-cut materials, as well as in high speed cutting of various steels and cast irons, the coated cermet tool of the present invention occurs no chipping, shows excellent wear resistance, and exhibits high cutting performance for a long period of time. Therefore, the coated cermet tools of the invention can sufficiently satisfy demands for enhanced performance of cutting machines, power saving, energy saving and cost reduction during cutting operation.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A surface coated cermet cutting tool comprising:
a tool body made of tungsten carbide based hardmetal or a titanium carbonitride based cermet, and
a hard coating layer vapor deposited on the surface of the tool body, the hard coating layer having:
a lower layer of titanium compound having an overall average thickness of 3 to 20 μm and consisting of one or more chemically vapor-deposited layers selected from a titanium carbide layer, a titanium nitride layer, a titanium carbonitride layer, a titanium carboxide layer, and a titanium oxycarbonitride layer; and
an upper layer of property-modified a type aluminum oxide, that has an average thickness of 2 to 20 μm, is composed of $Al_2O_3$ of α type crystal structure at a chemically deposited state, and has a crystal grain boundary orientation such that intersection angles between normals of (0001) planes and intersection angles between normals of {10-10} planes are 15° or less in grain boundary units of not less than 45% in number over all the grain boundaries,
wherein each of the crystal grain boundary units denotes a grain boundary between two adjacent crystal grains, and the crystal grain boundary orientation of the upper layer is determined using a field emission type scanning electron microscope and an electron-backscattered diffraction pattern imaging device by a method comprising;
irradiating an electron beam on each of crystal grains having a hexagonal crystal lattice in a measurement region on a polished surface;
performing a measurement of an intersection angle of normal of each of crystal faces subtending to a normal of the polished surface;
selecting (0001) planes and {10-10} of each crystals based on the measurement; and
determining an intersection angle between normals of (0001) planes and an intersection angle between normals of {10-10} planes at each of the crystal grain boundary units.

* * * * *